US 8,145,158 B2

(12) United States Patent
Salle et al.

(10) Patent No.: US 8,145,158 B2
(45) Date of Patent: Mar. 27, 2012

(54) BIAS CIRCUIT FOR A RADIO FREQUENCY POWER-AMPLIFIER AND METHOD THEREFOR

(75) Inventors: Didier Salle, Toulouse (FR); Arnaud Girardot, Tournefeuille (FR); Gerald Haennig, Toulouse (FR); Pierre Savary, Muret (FR)

(73) Assignee: Freescale Semiconductor, Inc., Austin, TX (US)

( * ) Notice: Subject to any disclaimer, the term of this patent is extended or adjusted under 35 U.S.C. 154(b) by 729 days.

(21) Appl. No.: 12/295,738

(22) PCT Filed: Apr. 3, 2006

(86) PCT No.: PCT/EP2006/005309
§ 371 (c)(1),
(2), (4) Date: Oct. 2, 2008

(87) PCT Pub. No.: WO2007/112772
PCT Pub. Date: Oct. 11, 2007

(65) Prior Publication Data
US 2009/0270057 A1    Oct. 29, 2009

(51) Int. Cl.
*H01Q 11/12*    (2006.01)
*H04B 1/04*    (2006.01)
(52) U.S. Cl. ..................... 455/127.1; 455/117
(58) Field of Classification Search ............. 455/127.1, 455/117
See application file for complete search history.

(56) References Cited

U.S. PATENT DOCUMENTS

| | | | | |
|---|---|---|---|---|
| 6,819,941 B2* | 11/2004 | Dening et al. | ............. | 455/552.1 |
| 7,062,236 B2* | 6/2006 | Midtgaard et al. | ............. | 455/126 |
| 7,366,482 B2* | 4/2008 | Hara et al. | ................ | 455/127.1 |
| 7,702,300 B1* | 4/2010 | McCune | ....................... | 455/108 |
| 7,880,522 B2* | 2/2011 | Ouyang et al. | ................ | 327/172 |
| 2003/0073418 A1* | 4/2003 | Dening et al. | ................ | 455/126 |
| 2003/0155978 A1 | 8/2003 | Pehlke | | |
| 2006/0046666 A1* | 3/2006 | Hara et al. | ................ | 455/127.1 |
| 2008/0125061 A1* | 5/2008 | Kuriyama et al. | ......... | 455/127.1 |
| 2008/0242246 A1* | 10/2008 | Minnis et al. | ............. | 455/127.1 |
| 2009/0270057 A1* | 10/2009 | Salle et al. | ................ | 455/127.1 |
| 2009/0295445 A1* | 12/2009 | Ouyang et al. | ................ | 327/172 |
| 2010/0208602 A1* | 8/2010 | Stolt et al. | ..................... | 370/252 |

FOREIGN PATENT DOCUMENTS

WO    03081768 A    10/2003

* cited by examiner

*Primary Examiner* — Lincoln Donovan
*Assistant Examiner* — Adam Houston

(57) ABSTRACT

A wireless communication unit comprises a transmitter having a power amplifier biased by a bias circuit and a controller operably coupled to the bias circuit for setting one or more bias levels of the power amplifier. The bias circuit is a single bias circuit and is configured to provide either a current mode bias control of the power amplifier or a voltage mode bias control of the power amplifier in response to a control signal from the controller. In this manner, a single bias control circuit can be used to support applications that benefit from both current mode bias control and voltage mode bias control of the power amplifier.

23 Claims, 4 Drawing Sheets

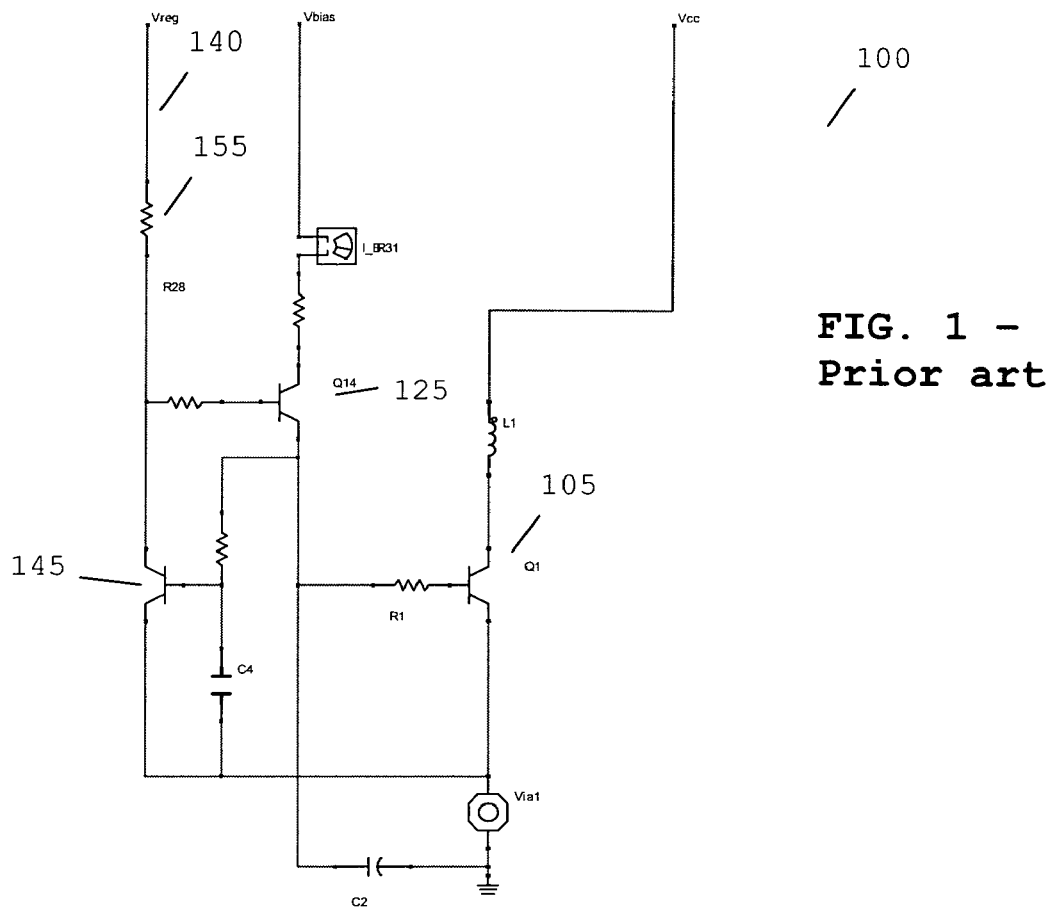
FIG. 1 – Prior art
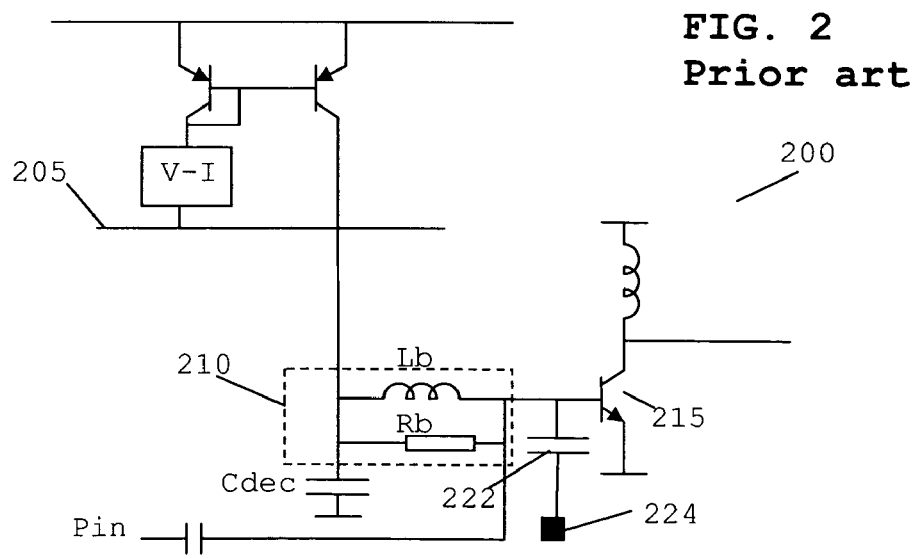
FIG. 2 Prior art

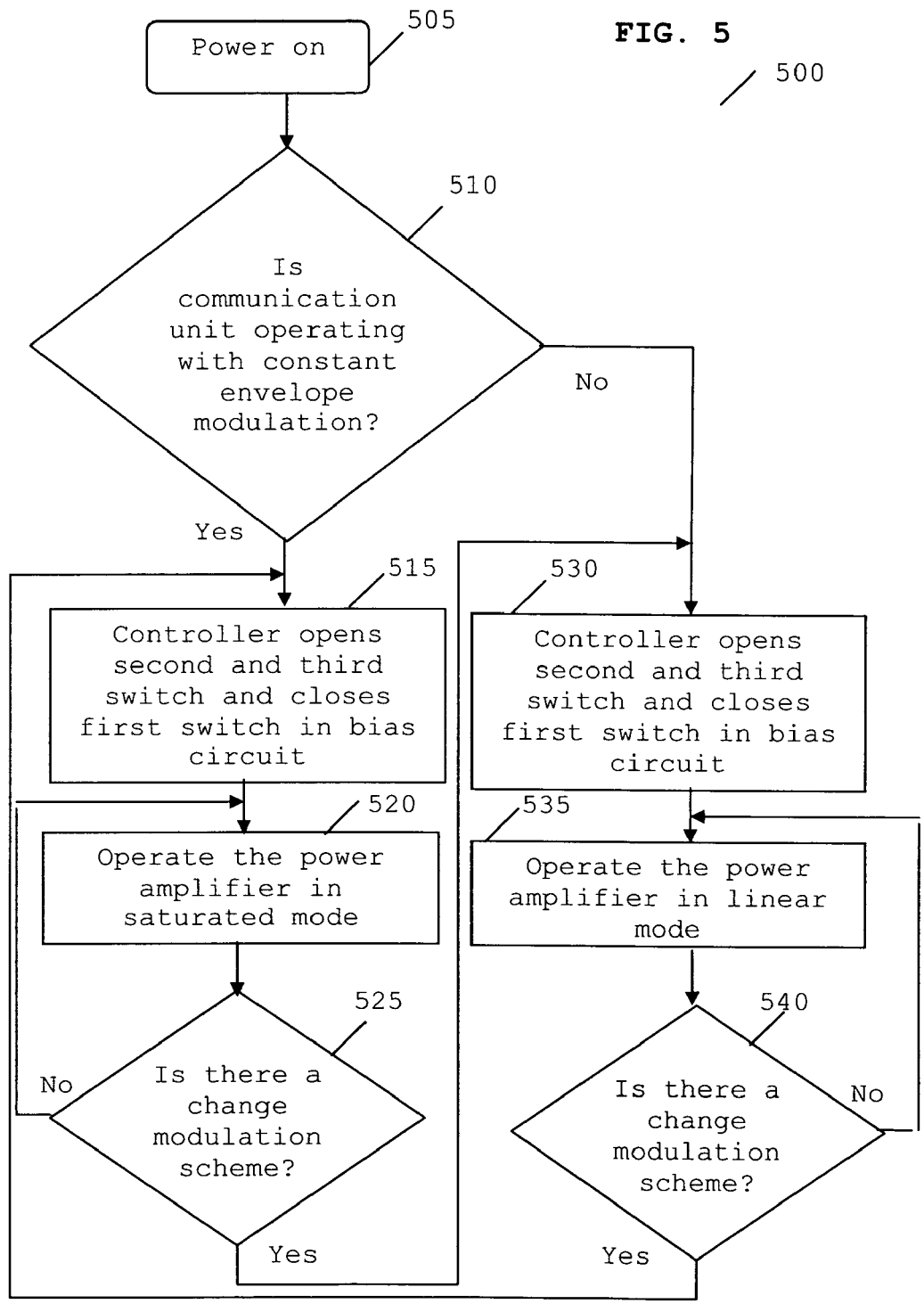

BIAS CIRCUIT FOR A RADIO FREQUENCY POWER-AMPLIFIER AND METHOD THEREFOR

FIELD OF THE INVENTION

One embodiment of the present invention relates to a bias circuit and method for biasing radio frequency (RF) and microwave power amplifiers (PAs), suitable for telecommunication applications. The invention is applicable to, but not limited to, a bias circuit and method of biasing a PA to transition between biasing in a current-mode of operation and a voltage-mode of operation on the same integrated circuit die.

BACKGROUND OF THE INVENTION

Wireless communication systems, for example cellular telephony or private mobile radio communication systems, typically provide for radio telecommunication links to be arranged between a plurality of base transceiver stations (BTS) and a plurality of subscriber units. An established harmonised cellular radio communication system, providing predominantly speech and short-data communication, is the Global System for Mobile Communications (GSM). GSM is often referred to as $2^{nd}$ generation cellular technology and utilises constant envelope Gaussian Minimum Shift Keying (GMSK) modulation.

An enhancement to this cellular technology, termed the General Packet Radio System (GPRS), has been developed. GPRS provides packet switched technology on GSM's switched-circuit cellular platform. A yet further enhancement to GSM, which has been developed to improve system capacity can be found in the recently standardised Enhanced Data Rate for Global Evolution (EDGE) that encompasses Enhanced GPRS (EGPRS). A still yet further harmonised wireless communication system currently being defined is the universal mobile telecommunication system (UMTS). UMTS is intended to provide a harmonised standard under which cellular radio communication networks and systems will provide enhanced levels of interfacing and compatibility with many other types of communication systems and networks, including fixed communication systems such as the Internet. Due to this increased complexity, as well as the features and services that it supports; UMTS is often referred to as a third generation (3G) cellular communication technology.

A primary focus of the present invention is the field of radio frequency (RF) and microwave power amplifiers for use in telecommunication applications. Continuing pressure on the limited spectrum available for radio communication systems is forcing the development of spectrally-efficient linear modulation schemes. Since the envelopes of a number of these 'linear' modulation schemes fluctuate, intermodulation products can be generated in the non-linear power amplifier. This results in the average power being delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier. 3G technology, in addition to Edge, utilises non-constant envelope modulation.

There are two known mechanisms for biasing the power amplifier (PA) in such wireless communication applications:

(i) Voltage-mode biasing. Voltage-mode biasing is typically used for PAs operating in a linear mode, for example to support linearity requirements of non constant envelope signals; and (ii) Current-mode biasing. Current mode biasing is typically used for PAs operating in a 'saturated' mode, for example to support GSM communications. A current-biasing mode of operation is used in this regard to solve the problem of dependency of the PA response to input power.

Referring now to FIG. 1, a known circuit 100 for voltage-mode biasing of a Power amplifier is illustrated. A biasing current source composed of a reference voltage 140, and a series resistor 155 is operably coupled to an input port of the power amplifier device 105 via a current-to-voltage converter. The current-to-voltage converter comprises a follower transistor 125 arranged to provide a low impedance to the base of reference transistor 145, that receives a current from current source 140, 155. The current from the biasing current source 140, 155 flows into reference transistor 145 and generates a voltage, which is supplied to the base of the PA device 105.

Thus, in this manner, the current source is coupled to the input port of the PA device 105, via the current-to-voltage converter, thereby biasing the PA 105 in a 'voltage-controlled' mode of operation. This design is termed an 'Augmented emitter follower'.

Referring now to FIG. 2, a known alternative circuit 200 for biasing a power amplifier in a current-mode of operation is illustrated. The bias circuit comprises a biasing current source providing a current 205 to an input port of the power amplifier device 215 via base impedance 210. The input port of the PA device 215 comprises capacitive coupling 222 to the radio frequency input signal 224. Thus, the current source directly sets the current applied to the (base) input port of the PA device 215, thereby biasing the PA in a current-controlled mode of operation.

There has been a recent trend for subscriber unit manufacturers, and consequently the semiconductor manufacturers designing integrated circuits to support the technologies implemented in the subscriber units, to offer dual-mode or multi-mode operation. In this regard, the subscriber unit and associated integrated circuits are capable of switching between operational modes in accordance with, say, user-requirements of services or features that they want to use. Often these dual-mode or multi-mode operations conflict from a technology perspective and separate circuitry is then required to support the individual modes. In order to support both constant-envelope modulation schemes and non-constant envelope modulation schemes, a wireless communication unit would currently require separate current-mode and voltage-mode bias circuits.

Thus, a need exists for providing a power amplifier bias circuit, integrated circuit and method for biasing a Power Amplifier (PA).

SUMMARY OF THE INVENTION

In accordance with aspects of the present invention, there is provided a wireless communication unit, an integrated circuit comprising a bias circuit for biasing a Power Amplifier (PA) and a method of biasing therefor, as defined in the appended Claims.

BRIEF DESCRIPTION OF THE DRAWINGS

FIG. 1 illustrates a known mechanism to bias a Power Amplifier in a voltage-mode of operation.

FIG. 2 illustrates a known mechanism to bias a Power Amplifier in a current-mode of operation.

Figure 3:
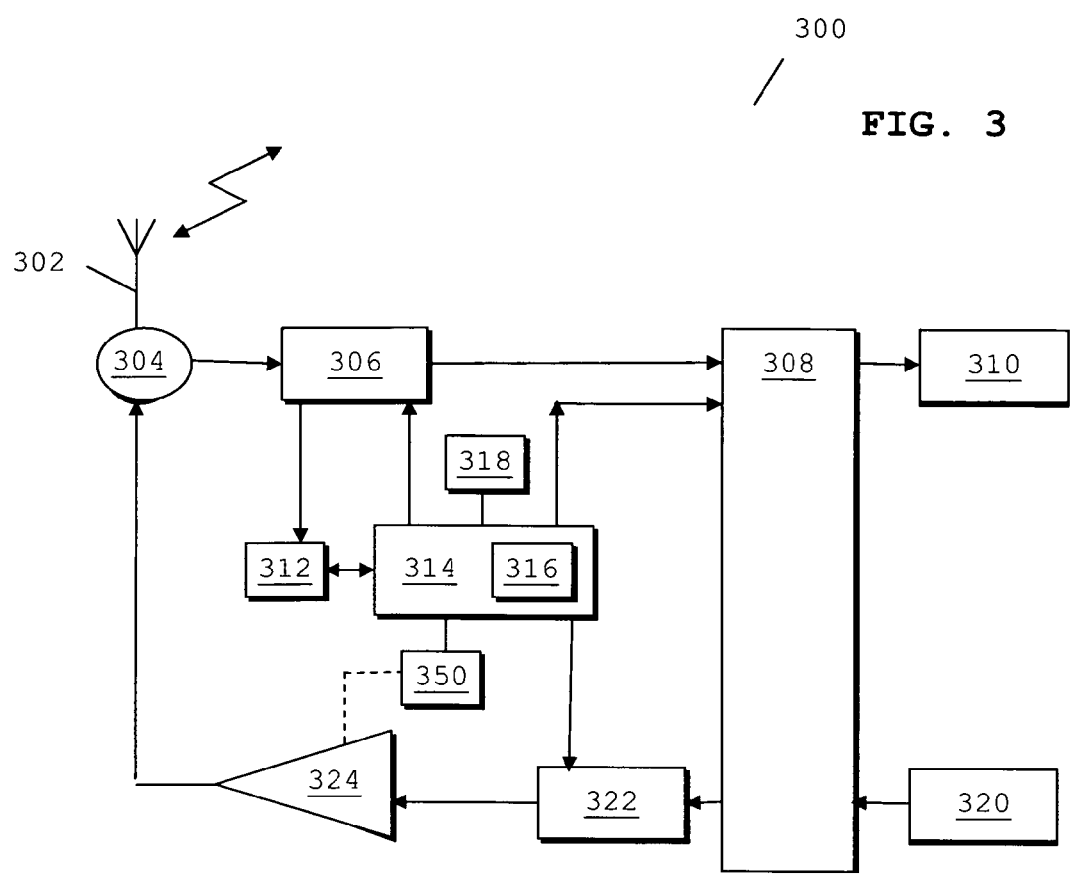
Figure 4:
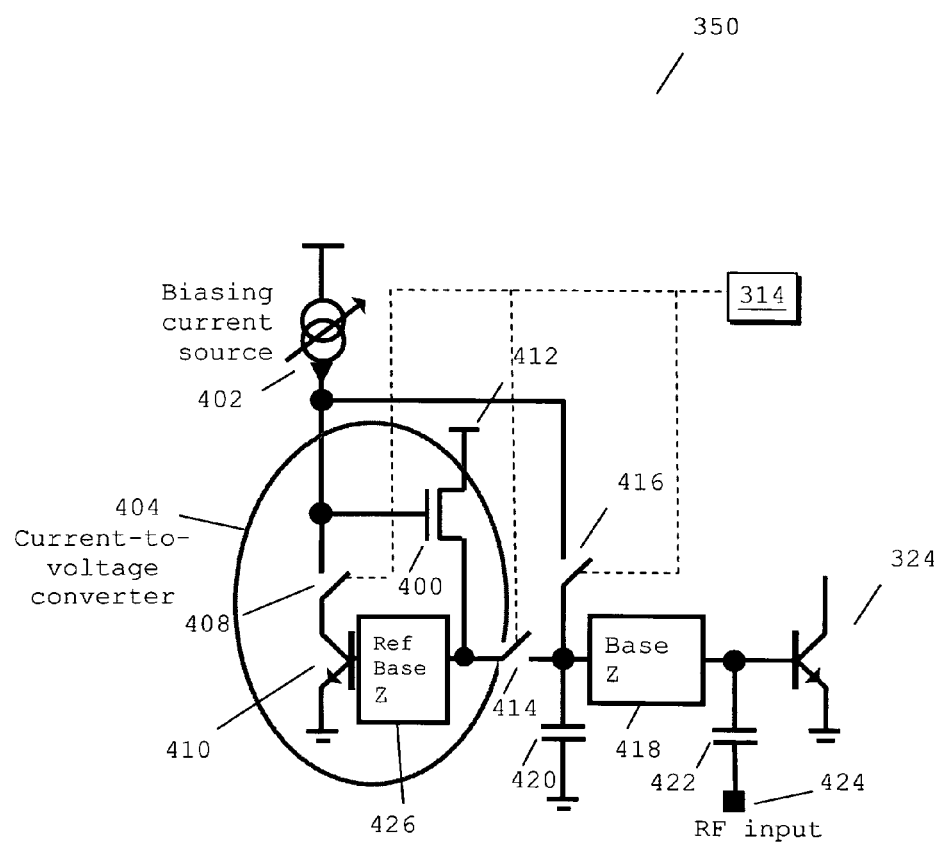

Exemplary embodiments of the present invention will now be described, by way of example only, with reference to the accompanying drawings, in which:

FIG. 3 illustrates a wireless communication unit adapted in accordance with embodiments of the present invention;

FIG. 4 illustrates a single circuit providing both voltage and current biasing of a power-amplifier in accordance with one embodiment of the present invention; and FIG. 5 illustrates a method of transitioning between voltage and current biasing of a power-amplifier in accordance with one embodiment of the present invention.

DESCRIPTION OF EMBODIMENTS OF THE INVENTION

In summary, embodiments of the present invention relate to a bias circuit for a Power Amplifier (PA) for a wireless communication unit and more particularly to a bias circuit capable of operating the PA both in saturated mode (e.g. in accordance with the GSM standard) and in a linear mode (e.g. in accordance with the EDGE or wideband code division multiple access (WCDMA) standard). In this regard, a bias circuit and method of operation therefor are described to facilitate transitioning between biasing a Power Amplifier (PA) in current-mode and in voltage-mode. Notably, the bias circuit and method of operation therefor can advantageously be readily implemented within the same integrated circuit die.

One embodiment of the present invention will be described in terms of a wireless subscriber communication unit. However, it will be appreciated by a skilled artisan that the inventive concept herein described may be embodied in any wireless communication unit, such as a base station, where at least two modes of operation are supported, for example a first mode that is constant envelope modulation and a second non-constant envelope modulation mode. Furthermore, the inventive concept can be applied to any type of power amplifier design where a transition between voltage-mode biasing and current-mode biasing may be desirable.

Referring now to FIG. 3, a block diagram of a wireless communication unit (for example a mobile subscriber unit (MS) in the context of cellular communications) is shown, adapted in accordance with embodiments of the present invention.

The MS 300 contains an antenna 302 typically coupled to a duplex filter or antenna switch 304 that provides isolation between receive and transmit chains within the MS 300. For completeness, the receiver chain, as known in the art, includes receiver front-end circuit 306 (effectively providing reception, filtering and intermediate or base-band frequency conversion). The front-end circuit 306 is serially coupled to a signal processing function 308. An output from the signal processing function 308 is provided to a suitable output device 310, such as a screen or flat panel display. The receiver chain also includes received signal strength indicator (RSSI) circuitry 312, which in turn is coupled to a controller 314 that maintains overall subscriber unit control. The controller 314 may therefore receive bit error rate (BER) or frame error rate (FER) data from recovered information. The controller 314 is also coupled to the receiver front-end circuitry 306 and the signal processing function 308 (generally realised by a digital signal processor (DSP)). The controller is also coupled to a memory device 316 that selectively stores operating regimes, such as decoding/encoding functions, synchronisation patterns, code sequences, RSSI data, direction of arrival of a received signal and the like.

In accordance with embodiments of the invention, the memory device 316 stores configuration settings primarily in the form of control signals to be applied to bias circuit switches, to open or close the respective switches, in response to the mode of operation of the wireless communication unit. In particular, the stored configuration settings enable the wireless communication unit to readily transition between voltage-mode biasing and current-mode biasing of the PA. Furthermore, a timer 318 is operably coupled to the controller 314 to control the timing of operations (transmission or reception of time-dependent signals), particularly with respect to timing of control signals applied to the switches in the bias circuit 350 within the MS 300.

As regards the transmit chain, this essentially includes an input device 320, such as a keypad, coupled in series through transmitter/modulation circuitry 322 and a power amplifier 324 to the antenna 302. The transmitter/modulation circuitry 322 and the power amplifier 324 are operationally responsive to the controller 314. Indeed, in accordance with embodiments of the present invention, the controller 314 is adapted to modify the configuration of the bias circuit 350 in response to the mode of operation of the MS 300, as described below with respect to FIG. 4.

Referring now to FIG. 4, an exemplary bias circuit 350 is illustrated that facilitates the transitioning between voltage-mode biasing and current-mode biasing of a power-amplifier 324, in response to control signals from a controller 314, in accordance with embodiments of the present invention. The bias circuit 350 comprises a biasing current source 402 operably coupled, in a first current path, to an input port of the power amplifier device 324 via a first switch 416. The configuration of the first switch is controlled by controller 314. The input port of the PA device 324 comprises capacitive coupling 422 to the radio frequency input signal 424. The input port comprises base impedance 418 and capacitive de-coupling 420, where the first switch 416 is operably coupled to the junction of the base impedance 418 and capacitive de-coupling 420. Thus, when the first switch 416 is closed by the controller 314, the current source is coupled to the input port of the PA device 324, thereby biasing the PA in a 'current-controlled' mode of operation.

The biasing current source 402 is also operably coupled, in a second current path, to an input port of the power amplifier device 324 via a current-to-voltage converter 404 and third switch 414. The current-to-voltage converter 404 comprises a follower transistor 400, a reference transistor 410, and reference base impedance 426. The follower transistor 400 provides a low impedance to the base of reference transistor 410, receiving a current from current source 402. The current source is operably coupled to the reference transistor 410 via a second switch 408. The reference base impedance 426 balances the base impedance 418. The emitter port of the reference transistor 410 may be grounded, say via an impedance, as known in the art. The current from the biasing current source 402 flows into reference transistor 410, which generates a base voltage that is supplied to the base of the PA device through the reference base impedance and the third switch 414.

In one embodiment of the present invention, it is envisaged that two current sources could be used, one for either mode, in contrast to the embodiment described that utilises a single current source for both modes of operation.

In embodiments of the present invention, impedances may be operably coupled to the base ports of the transistors, such as base impedance 418 coupled to the base port of the PA device 324. The configuration of the second switch 408 and third switch 414 are also controlled by controller 314.

In summary, controller 314 is operably coupled to a number of switches, where the configuration of the respective switches supports either current-mode biasing, or voltage-mode biasing. That is when controller 314 closes the second switch 408 and third switch 414, and opens first switch 416, the controller transitions (re-configures) the bias circuit 350 to voltage-mode biasing.

Furthermore, when controller 314 opens the second switch 408 and third switch 414, and closes first switch 416, the controller transitions (i.e. re-configures) the bias circuit 350 to current-mode biasing.

In this manner, when the wireless communication unit is operating in GSM mode, i.e. the PA is operating in a saturated mode, the controller 314 configures the switches to support current-biasing, thereby solving the problem of dependency of the PA response to input power.

In contrast, when the wireless communication unit is operating in a linear mode, for example supporting non constant envelope modulation schemes, such as those required for Edge or (3G) WCDMA applications, the controller 314 configures the switches to support voltage-biasing, thereby providing a linear PA output.

It is envisaged that an integrated circuit manufacturer may manufacture a bias circuit (which may in some embodiments include other circuits as would be appreciated by a skilled person) that comprises at least one input control pin that is coupleable to the microcontroller 314 and comprises the aforementioned circuit elements up to the PA and its RF input. In some embodiments, the bias control current source may be provided within the bias circuit IC or the bias control current source may be directly input to a 'current source input' of the bias circuit IC.

Advantageously, embodiments of the present invention support having both biasing modes available on the same integrated circuit (IC) die. In one embodiment of the present invention, the two operating modes are selectable by a simple logic level input, for example using an inverter coupled to second and third switches to differentiate their configuration from the first switch. In this manner, the transitioning between current-mode biasing and voltage-mode biasing can be controlled by applying different logic values to a single IC pin.

Advantageously, the aforementioned bias circuit biasing a PA reduces the sensitivity of the power amplifier performance to the range of input power ($P_{in}$) levels. Thus, in current-controlled mode, the base current is constrained and therefore varying the input power has little impact on output power. In contrast, in a voltage-controlled mode, the base current is unlimited and varies with input power. By constraining the base current to the PA 324 in a current-controlled mode, particularly by constraining a first stage of the PA device 324 that receives 'varying' input power, improves the wireless communication unit's robustness to power control effects. Consequently, it also improves the wireless communication unit's robustness to manufacturability tolerances of the integrated circuit and elements therein.

However, in other embodiments of the present invention, it is envisaged that the aforementioned arrangement may be utilised in later stages or across multiple stages, depending upon the design considerations, performance criteria and circuit elements prevalent at the time.

Referring now to FIG. 5, a method 500 of transitioning between voltage and current biasing of a power-amplifier is illustrated, in accordance with embodiments of the present invention. The method commences with the wireless communication unit switching on, in step 505. A determination is then made as to whether the communication unit is to operate with a constant envelope modulation scheme or non-constant envelope modulation scheme, as shown in step 510. Such a determination may utilise a default operating mode in the wireless communication unit, for example where the user typically operates in a current-mode biasing mode for a coverage area supported by GSM. Alternatively, the determination may be made based on a preferred operating mode of a user of the wireless communication unit, for example that the user typically uses multimedia services supported by UMTS.

If the communication unit determines that it is to operate with a constant envelope modulation scheme in step 510, the controller (say controller 314 of FIG. 3) opens second and third switches (switches 408, 414 in FIG. 4) and closes the first switch (switch 416 in FIG. 4), as in step 515. The power amplifier is then configured to operate in saturated mode, via configuration of the bias circuit, as shown in step 520.

A determination is then made as to whether there is a change in operating mode of the wireless communication unit, for example a change in the modulation scheme used to a non-constant envelope modulation scheme, as in step 525. If there is no change in the modulation scheme used in step 525, the power amplifier continues to be configured to operate in saturated mode, via configuration of the bias circuit, as shown in step 520. However, if it is determined, in step 525 that the modulation scheme is to be changed, for example to a non-constant envelope modulation scheme in step 525, the controller re-configures the bias circuit in accordance with step 530.

If the communication unit determines that it is to operate with a non-constant envelope modulation scheme in step 510, the controller (say controller 314 of FIG. 3) closes second and third switches (switches 408, 414 in FIG. 4) and opens the first switch (switch 416 in FIG. 4), as in step 530. The power amplifier is then configured to operate in a linear mode, via configuration of the bias circuit, as shown in step 535.

A determination is then made as to whether there is a change in operating mode of the wireless communication unit, for example a change in the modulation scheme used to a constant envelope modulation scheme, as in step 540. If there is no change in the modulation scheme used in step 540, the power amplifier continues to be configured to operate in a linear mode, via configuration of the bias circuit, as shown in steps 530, 535. However, if it is determined, in step 540, that the modulation scheme is to be changed, for example to a constant envelope modulation scheme, the controller re-configures the bias circuit in accordance with step 515, as described previously.

In this manner, the controller of the wireless communication unit is able to re-configure the bias circuit to support different modulation schemes via re-configuring the operating mode of the power amplifier device.

It will be understood that the improved biasing circuit and method for biasing a PA, as described above, aims to provide at least one or more of the following advantages:

(i) The biasing circuit and method for biasing a PA supports both current-mode and voltage-mode biasing.
(ii) The current-mode and voltage-mode biasing of a power amplifier can be implemented on a single integrated circuit die.
(iii) The current-mode and voltage-mode biasing of a power amplifier can be implemented via a simple logic adjustment on a single integrated circuit pin.
(iv) The biasing circuit and method for biasing a PA provides an advantageous implementation for dual-mode and multi-mode wireless communication units.
(v) The biasing circuit and method for biasing a PA is less sensitive to input power ($P_{in}$) variations.

(vi) The biasing circuit and method for biasing a PA provides improved robustness to bias control, for example more tolerance to variations in manufacturing processes, $V_{cc}$, temperature, frequency, antenna voltage standing wave ratio, etc.

It will be appreciated that any suitable distribution of functionality between different functional units or circuit elements may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, although embodiments of the present invention have been described where the functionality may be implemented in a single unit or IC, it is envisaged that in other embodiments the circuit functionality may be implemented in a plurality of units or ICs or as part of other functional units.

In particular, it is envisaged that the aforementioned inventive concept can be applied by a semiconductor manufacturer to any integrated circuit comprising a power amplifier biasing circuit, for example those of the Freescale™ power amplifier device family. It is further envisaged that, for example, a semiconductor manufacturer may employ the inventive concept in a design of a stand-alone device or application-specific integrated circuit (ASIC) and/or any other sub-system element.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to "a", "an", "first", "second" etc. do not preclude a plurality.

Thus, embodiments of the present invention describe a wireless communication unit having a PA and bias circuit therefor, an integrated circuit comprising a bias circuit and method for biasing a PA that support transitioning between a current-mode and a voltage-mode of biasing the Power Amplifier (PA), wherein the aforementioned disadvantages with prior art arrangements have been substantially alleviated.

The invention claimed is:

1. A wireless communication unit comprising:
a transmitter having a power amplifier biased by a bias circuit connected to a base of the power amplifier and a controller operably coupled to the bias circuit for setting one or more bias levels applied to the power amplifier, wherein the bias circuit is configured to provide either a current to the base to implement a current mode bias control of the power amplifier or a voltage to the base to implement a voltage mode bias control of the power amplifier in response to a control signal from the controller, wherein the bias circuit comprises a current source operably coupled to an input port of the power amplifier via a first switch that is configured by the controller to be in a closed position when biasing the power amplifier in a current mode and in an open position when biasing the power amplifier in a voltage mode.

2. The wireless communication unit of claim 1 wherein the controller configures the bias circuit to provide current mode biasing of the power amplifier to operate the power amplifier in a saturated mode.

3. The wireless communication unit of claim 2 wherein the power amplifier is configured to operate in the saturated mode to support a constant envelope modulation scheme used by the wireless communication unit.

4. The wireless communication unit of claim 3 wherein the constant envelope modulation scheme used by the wireless communication unit is a GSM constant envelope modulation scheme.

5. The wireless communication unit of claim 1 wherein the controller configures the bias circuit to provide the voltage mode biasing of the power amplifier to operate the power amplifier in a linear mode.

6. The wireless communication unit of claim 5 wherein the linear mode is a non-constant envelope modulation scheme used by the wireless communication unit.

7. The wireless communication unit of claim 5 wherein the power amplifier is configured to operate in the linear mode to support the wireless communication unit transmitting Edge or WCDMA communication.

8. The wireless communication unit of claim 5, wherein the bias circuit comprises a current-to-voltage converter circuit that is activated when biasing the power amplifier in the voltage mode.

9. The wireless communication unit of claim 8, wherein the current-to-voltage converter circuit is located between a biasing current source and the input port of the power amplifier, wherein the current-to-voltage converter circuit comprises a second switch located between the biasing current source and a reference transistor and a third switch located between a base port of the reference transistor and the input port of the power amplifier wherein the second switch and third switch are configured by the controller to be in a closed position when biasing the power amplifier in the voltage mode.

10. An integrated circuit comprising:
a power amplifier; and
a bias circuit for biasing a power amplifier in response to a control signal, the bias circuit is configured to set one of a bias current for the power amplifier to provide current mode bias control of the power amplifier and a bias voltage for the power amplifier to provide voltage mode bias control of the power amplifier in response to the control signal, wherein the bias circuit comprises a current source operably coupled to an input port of the power amplifier via a first switch that is configured by a controller to be in a closed position when biasing the power amplifier in a current mode and in an open position when biasing the power amplifier in a voltage mode.

11. The integrated circuit of claim 10 wherein an output signal from the bias circuit provides the current mode biasing to operate the power amplifier in a saturated mode.

12. The integrated circuit of claim 11 wherein an output signal from the bias circuit provides the current mode biasing to support a constant envelope modulation scheme used by the power amplifier.

13. The integrated circuit of claim 12 wherein the constant envelope modulation scheme is a GSM constant envelope modulation scheme.

14. The integrated circuit of claim 10 wherein output signal from the bias circuit provides the voltage mode biasing to operate the power amplifier in a linear mode.

15. The integrated circuit of claim 14 wherein the linear mode is a non-constant envelope modulation scheme.

16. The integrated circuit of claim 14 wherein the non-constant envelope modulation scheme supports Edge or WCDMA communication.

17. The integrated circuit of claim 10, wherein the bias circuit comprises a current-to-voltage converter circuit that is activated by the control signal when biasing the power amplifier in the voltage mode.

18. The integrated circuit of claim 17, wherein the current-to-voltage converter circuit comprises a second switch located between a biasing current source and a reference transistor and a third switch located between a base port of the reference transistor and a bias output of the bias circuit wherein the second switch and the third switch are configured by the control signal to be in a closed position when biasing the power amplifier in the voltage mode.

19. The integrated circuit of claim 10, wherein the control signal is applied to a control pin of the integrated circuit to configure the bias circuit.

20. A method of biasing a power amplifier in a wireless communication unit, the method comprising:
   receiving a bias control signal from a controller;
   configuring, in response to the bias control signal having a first state, a first switch of a single bias circuit having a current source to be in a closed position to provide a current mode bias control of the power amplifier to a base of the power amplifier; or
   configuring, in response to the bias control signal having a second state, the first switch to be in an open position to provide a voltage mode bias control of the power amplifier to the base of the power amplifier.

21. The method of claim 20 wherein the step of configuring comprises configuring a bias circuit to provide current mode biasing of the power amplifier to operate the power amplifier in a saturated mode.

22. The method of claim 20 wherein the step of configuring comprises configuring a bias circuit to provide voltage mode biasing of the power amplifier to operate the power amplifier in a linear mode.

23. The method of claim 20, wherein the step of configuring comprises switching a plurality of switches to an open position or a closed position to bias the power amplifier.

* * * * *